(12) United States Patent
Le et al.

(10) Patent No.: US 6,717,447 B1
(45) Date of Patent: Apr. 6, 2004

(54) DELAY ADJUSTMENT CIRCUIT

(75) Inventors: Thoai-Thai Le, Cary, NC (US); Ralf Klein, Munich (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/271,955

(22) Filed: Oct. 15, 2002

(51) Int. Cl.[7] .................................................. H03L 7/00
(52) U.S. Cl. ....................................... 327/161; 327/153
(58) Field of Search ................................. 327/276, 149, 327/152, 153, 155, 158, 161

(56) References Cited

U.S. PATENT DOCUMENTS

| | | | | |
|---|---|---|---|---|
| 6,137,327 A | * | 10/2000 | Schnell | 327/158 |
| 6,265,903 B1 | * | 7/2001 | Takahashi | 327/7 |
| 6,388,482 B1 | * | 5/2002 | Schnell et al. | 327/158 |

FOREIGN PATENT DOCUMENTS

JP 56093105 A * 7/1981 ............ G11B/5/09

* cited by examiner

Primary Examiner—Timothy P. Callahan
Assistant Examiner—Cassandra Cox
(74) Attorney, Agent, or Firm—Brinks Hofer Gilson & Lione

(57) ABSTRACT

A delay adjustment circuit for decreasing a phase shift between a system clock and a feedback clock from a semiconductor's internal clock. The circuit includes a difference-pulse generator that provides an interim clock 180 degrees out of phase with the feedback clock when the feedback clock is leading the system clock, and equal to the feedback clock otherwise. The difference-pulse generator also provides a difference-pulse signal that is at logic high for a period of time by which the system clock and an inversion of the interim clock are phase shifted. The circuit also includes a delay control unit and a delay unit which delay the interim clock by the period of time. The resulting delayed interim clock, which is 180 degrees out of phase with the system clock, is inverted to provide an internal clock in phase with the system clock.

21 Claims, 7 Drawing Sheets

DELAY ADJUSTMENT CIRCUIT

BACKGROUND OF THE INVENTION

1. Technical Field

The present invention relates generally to delay adjustment circuits and, more particularly, to an improved delay adjustment circuit for synchronizing a system clock with an internal clock of a semiconductor device.

2. Related Art

Clock frequency requirements of semiconductor devices are continually increasing. This is especially true, for example, for devices such as Double Data Rate (DDR) synchronous dynamic random access memory (SDRAM) devices. It is important to synchronize an internal clock signal of a semiconductor device with a system clock signal in order to ensure accurate data communication between the device and a system. For this reason, semiconductor devices often include delay locked loops (DLLs).

A DLL facilitates synchronization of the device's internal clock signal with the system clock signal by compensating the internal clock signal for skew caused by gate and wiring loads. This compensation involves adjusting a delay period for the internal clock signal to minimize the phase shift between the internal clock signal and the system clock signal.

For a DDR SDRAM device, valid data is available for reading from the device in accordance with an internal clock signal that is derived from the system clock signal. The maximum number of wait cycles (column address strobe (CAS) latency) before the availability of valid data can be programmed in a mode register of the device. The maximum phase shift between the system clock signal and the internal clock signal is specified by JEDEC.

In practice, particularly in system applications, the DLL is often deactivated ("DLL off" mode) to lower device power consumption. Depending upon the device operating frequency, this deactivation can result in a large misalignment between the system clock and the internal clock. Consequently, in "DLL off" mode data may not be available for reading in accordance with JEDEC specifications, and the CAS latency may be changed from DL)R to single data rate (SDR). For example, a CAS latency of "3" indicates that data is available for reading after two clock cycles plus the data access time ($t_{AC}$), which in "DLL off" mode may range from four to six nanoseconds.

It would be desirable to have a delay adjustment circuit for decreasing the phase shift between a system clock signal and an internal clock signal that consumes less power than a typical DLL circuit. It would be further desirable to provide a delay adjustment circuit that operates independent of system operating frequency and CAS latency.

SUMMARY

A delay adjustment circuit for a semiconductor may include a difference-pulse generator that receives a system clock signal and a feedback clock signal and provides a difference-pulse signal that indicates a phase difference between the system clock signal and the feedback clock signal, and an interim clock signal that is selected from the group comprising the feedback clock signal and an inversion of the feedback clock signal. The delay adjustment circuit may also include a delay control unit in communication with the difference-pulse generator that receives the difference-pulse signal and provides a plurality of output signals that indicate the phase difference between the system clock signal and the interim clock signal. The delay adjustment circuit may further include a delay unit in communication with the difference-pulse generator and the delay control unit that receives the interim clock signal and the plurality of output signals, and provides an internal clock signal that is in phase with the system clock signal.

The difference-pulse signal may be at logic high for a period of time that the feedback clock signal is at logic low and the system clock signal is at logic high. The interim clock signal may be the feedback clock signal.

Alternatively, the difference-pulse signal may be at logic high for a period of time that the feedback clock signal is at logic high and the system clock signal is at logic high. The interim clock signal may be an inversion of the feedback clock signal.

The delay control unit may comprise a plurality of control cells and the delay unit may comprise a plurality of delay cells. Each control cell may provide one output signal, and each delay cell may receive one output signal.

The delay unit may delay the interim clock signal by one time unit for each of the plurality of output signals that is at logic high to produce a delayed interim clock signal, and provide the delayed interim clock signal as the internal clock signal. The interim clock signal may be the feedback clock signal when the feedback clock signal is lagging the system clock signal, and it may be an inversion of the feedback clock signal when the feedback clock signal is leading the system clock signal.

The delay control unit may comprise a pulse generator that receives an enable signal, detects an edge of the enable signal, and generates a reset signal that is at logic high for a first period of time after the edge of the enable signal is detected. The first period of time may be at least a period of the system clock. The difference-pulse generator may be in communication with the pulse generator, and may receive the reset signal and provide the difference-pulse signal when the reset signal is at logic high. The difference-pulse generator may determine whether the feedback clock signal is leading the system clock signal by sampling the feedback clock signal during a rising edge of the system clock signal.

A method for adjusting the delay of an internal clock of a semiconductor include receiving a system clock signal and a feedback clock signal and generating a difference-pulse signal that indicates a phase difference between the system clock signal and the feedback clock signal. The method may also include generating an interim clock signal that is selected from the group comprising the feedback clock signal and an inversion of the feedback clock signal. The method may further include generating a plurality of output signals that indicate the phase difference between the system clock signal and the interim clock signal. The method may further include delaying the interim clock signal by an amount of time that is a function of the phase difference indicated by the plurality of output signals to produce a delayed interim clock signal. The method may additionally include providing the delayed interim clock signal as an internal clock signal.

Generating a difference-pulse signal may include generating a logic high for a period of time that the feedback clock signal is at logic low and the system clock signal is at logic high. Alternatively, generating a difference-pulse signal may include generating a logic high for a period of time that the feedback clock signal is at logic high and the system clock signal is at logic high.

Generating an interim clock signal may include inverting the feedback clock signal when the feedback clock signal is leading the system clock signal. Generating a plurality of output signals may include generating one output signal at logic high for each time unit during a period of the system clock that the system clock signal is at logic high while the interim clock signal is at logic high.

Generating a difference-pulse signal may include receiving an enable signal, detecting an edge of the enable signal, generating a reset signal that is at logic high for a first period of time after the edge of the enable signal is detected, and generating a logic low when the first period of time after the edge of the enable signal is expired.

Generating an interim clock signal may include determining whether the feedback clock signal is leading the system clock signal by sampling the feedback clock signal during a rising edge of the system clock signal, and inverting the feedback clock signal when the feedback clock signal is leading the system clock signal.

A delay adjustment circuit for a semiconductor may include a means for receiving a system clock signal and a feedback clock signal and generating a difference-pulse signal that indicates a phase difference between the system clock signal and the feedback clock signal. The delay adjustment circuit may also include a means for generating an interim clock signal that is selected from the group comprising the feedback clock signal and an inversion of the feedback clock signal. The delay adjustment circuit may further include a means for generating a plurality of output signals that indicate the phase difference between the system clock signal and the interim clock signal. The delay adjustment circuit may also include a means for delaying the interim clock signal by an amount of time that is a function of the phase difference indicated by the plurality of output signals to produce a delayed interim clock signal, and providing the delayed interim clock signal as an internal clock signal.

BRIEF DESCRIPTION OF THE DRAWINGS

The components in the figures are not necessarily to scale, emphasis instead being placed upon illustrating the principals of the invention. Moreover, in the Figures, like reference numerals designate corresponding parts throughout the different views.

DETAILED DESCRIPTION OF THE PRESENTLY PREFERRED EMBODIMENT

Figure 1:
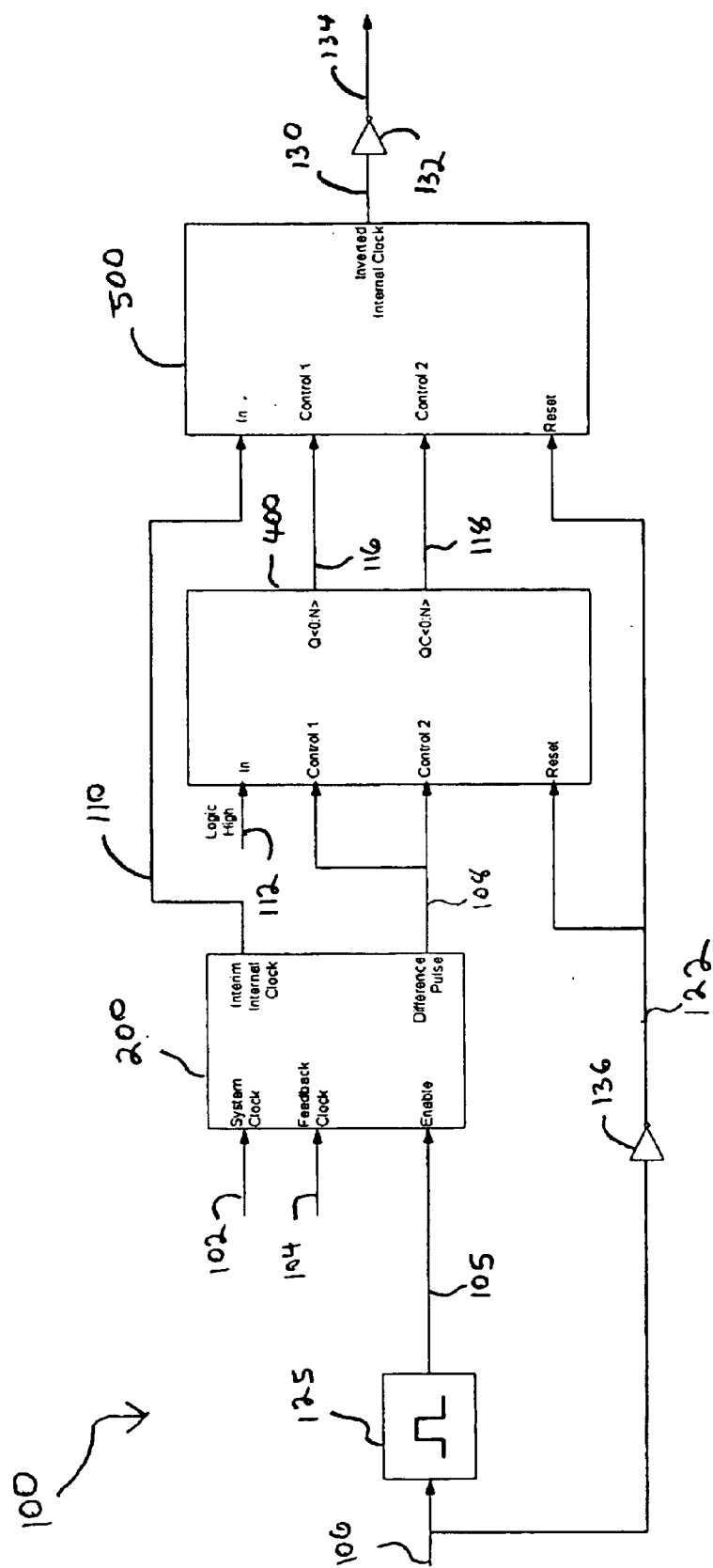
FIG. 1 is a block diagram of a delay adjustment circuit for synchronizing a system clock with an internal clock of a semiconductor device.

FIG. 1 is a block diagram of a delay adjustment circuit (DAC) 100 for synchronizing a system clock signal on line 102 with a feedback clock signal on line 104 of a semiconductor device. The system clock signal on line 102 may be received and amplified by a receiver (not shown) of the semiconductor prior to being received by DAC 100. The feedback clock signal on line 104 may be a feedback signal that is based on an internal clock signal on line 134, after the internal clock signal on line 134 has passed through a clock driver, an off-chip driver, a receiver, and/or other device circuitry that is not shown in the drawings. The feedback clock signal on line 104 may represent an internal clock signal on line 134 having a time delay associated with other device circuitry and impedances of system circuitry to which the semiconductor device is coupled.

The DAC 100 accomplishes synchronization by monitoring a phase shift between the system clock signal on line 102 and the feedback clock signal on line 104. If the feedback clock signal on line 104 is leading the system clock signal on line 102 by a delay time ($t_d$), the DAC 100 may delay an inversion of the feedback clock signal on line 104 by the delay time ($t_d$). This delayed inversion may then be inverted by the DAC 100 to produce the internal clock signal on line 134 in phase with the system clock signal on line 102.

Alternatively, if the feedback clock signal on line 104 is lagging the system clock signal on line 102 by a delay time ($t_d$), the DAC 100 may delay the feedback clock signal on line 104 by the delay time ($t_d$) This delayed feedback clock signal may then be inverted by the DAC 100 to produce the internal clock signal on line 134 in phase with the system clock signal on line 102.

The DAC 100 includes a difference-pulse generator 200, a delay control unit 400, a delay unit 500, a pulse generator 125, and inverters 132 and 136. The inverter 136 may provided an inverted enable signal on line 122 to the delay control unit 400 and the delay unit 500.

The pulse generator 125 may provide a reset signal on line 105 that is at logic low until the enable signal on line 106 transitions, for example, from logic high to logic low. When the pulse generator 125 detects this transition, it may bring the reset signal on line 105 to logic high for a period of time, for example, a period of the system clock signal on line 102. The reset signal on line 105 may cause the difference-pulse generator 200 to generate a pulse that is high for a period of time ($t_d$) that is a function of the phase difference between the system clock signal on line 102 and the feedback clock signal on line 104, and to determine an interim clock signal on line 110.

The delay control unit 400 receives the difference-pulse signal on line 108 and may generate output signals Q<0:n> on lines 116 and output signals QC<0:n> on lines 118. The delay unit 500 receives the interim clock signal on line 110, the output signals Q<0:n> on lines 116, and the output signals QC<0:n> on lines 118. The delay unit 500 may generate an inverted internal clock signal on line 130 as a function of the signals it receives. The inverter 132 may invert the inverted internal clock signal on line 130 to provide the internal clock signal on line 134.

The difference-pulse signal on line 108 may indicate a phase shift between the feedback clock signal on line 104 and the system clock signal on line 102. The interim clock signal on line 110 may be selected from group comprising the feedback clock signal on line 104 and an inversion of the feedback clock signal on line 104. The selection regarding the interim clock signal on line 110 may be a function of whether the feedback clock signal on line 104 leads or lags the system clock signal on line 102.

The difference-pulse generator 200 may be any circuit or device that provides a means for receiving a system clock signal and a feedback clock signal and generating a difference-pulse signal that indicates a phase difference between the system clock signal and the feedback clock signal, and for generating an interim clock signal that is selected from the group comprising the feedback clock signal and an inversion of the feedback clock signal.

Figure 2:
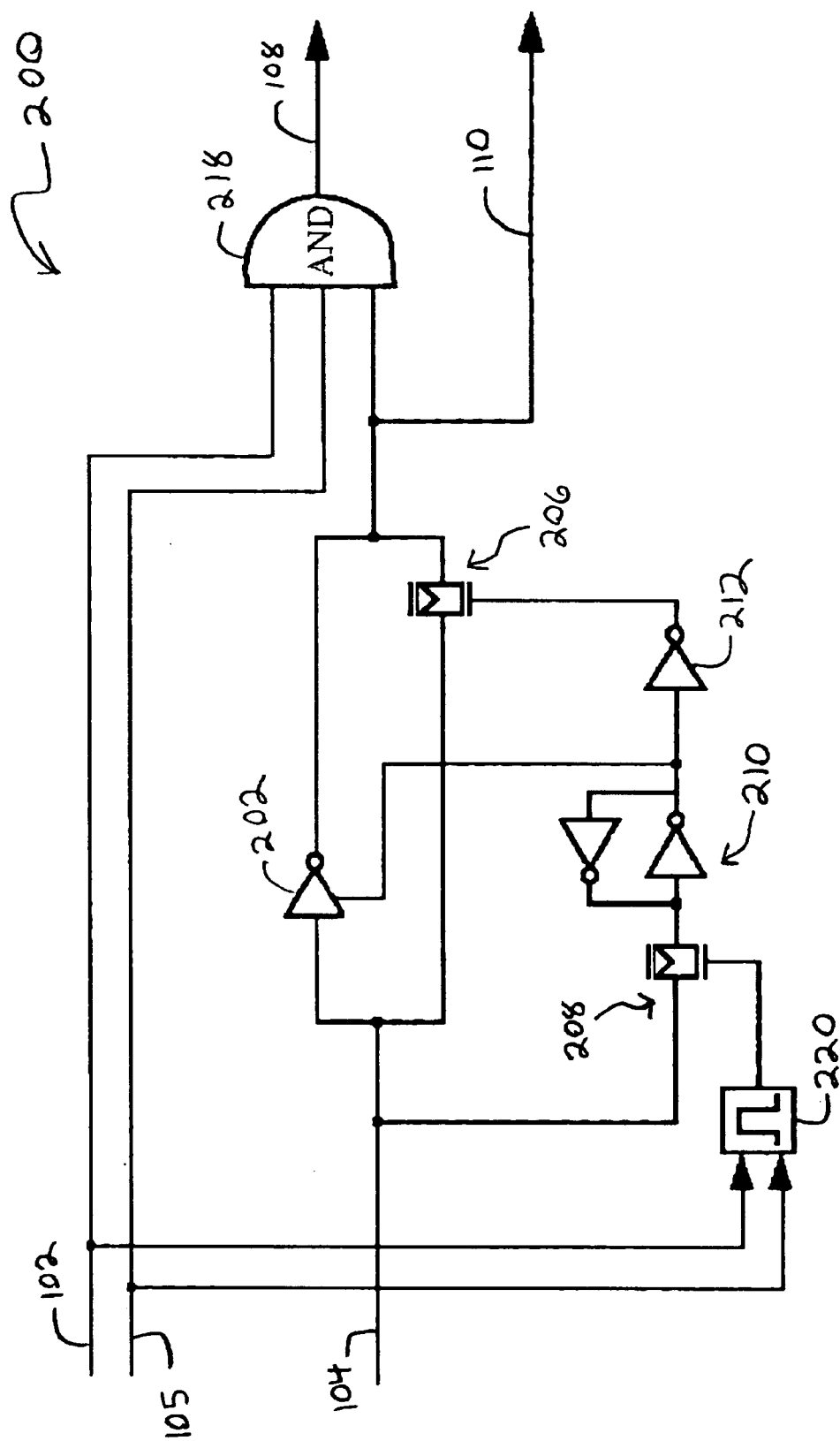
FIG. 2 is a logic diagram of a presently preferred embodiment of a difference-pulse generator for a delay adjustment circuit.

Turning to FIG. 2, a logic diagram of a presently preferred embodiment of the difference-pulse generator 200 is shown. An edge detector 220 detects a rising edge of the system clock signal on line 102 when the reset signal on line 105 is at logic high. When a rising edge is detected, the edge detector 220 may generate a pulse that activates a transfer gate 208 momentarily. When activated, the transfer gate 208 may conduct the feedback clock signal on line 104 to a latch 210. The latch 210 may store the inverse of the logic value of the feedback clock signal on line 104 until the transfer gate 208 is next activated. Therefore, the output of the latch 210 will be at logic high when the feedback clock signal is at logic low at the system clock signal rise, and at logic low when the feedback clock signal is at logic high at the system clock signal rise.

When the output of the latch 210 is at logic high, the latch 210 may activate an inverter 202. When activated, the inverter 202 may provide an inversion of the feedback clock signal on line 104 as the interim clock signal on line 110. If the output of the latch 210 is at logic low, an inverter 212 following the latch 210 may activate a transfer gate 206. When activated, the transfer gate 206 may provide the feedback clock signal on line 104 as the interim clock signal on line 110. In other words, when the feedback clock signal on line 104 is lagging the system clock signal on line 102, the interim clock signal on line 110 will be equal to the feedback clock signal on line 104. On the other hand, when the feedback clock signal on line 104 is leading the system clock signal on line 102, the interim clock signal on line 110 will be an inversion of to the feedback clock signal on line 104.

An AND gate 218 receives the interim clock signal on line 110 as a first input, the reset signal on line 105 as a second input, and the system clock signal on line 102 as a third input. The AND gate 218 may provide the difference-pulse signal on line 108 so that it is at logic high when all three of these inputs are at logic high. The operation of the difference-pulse generator 200 is best understood by examining illustrative signals that it receives and provides.

Figure 3:
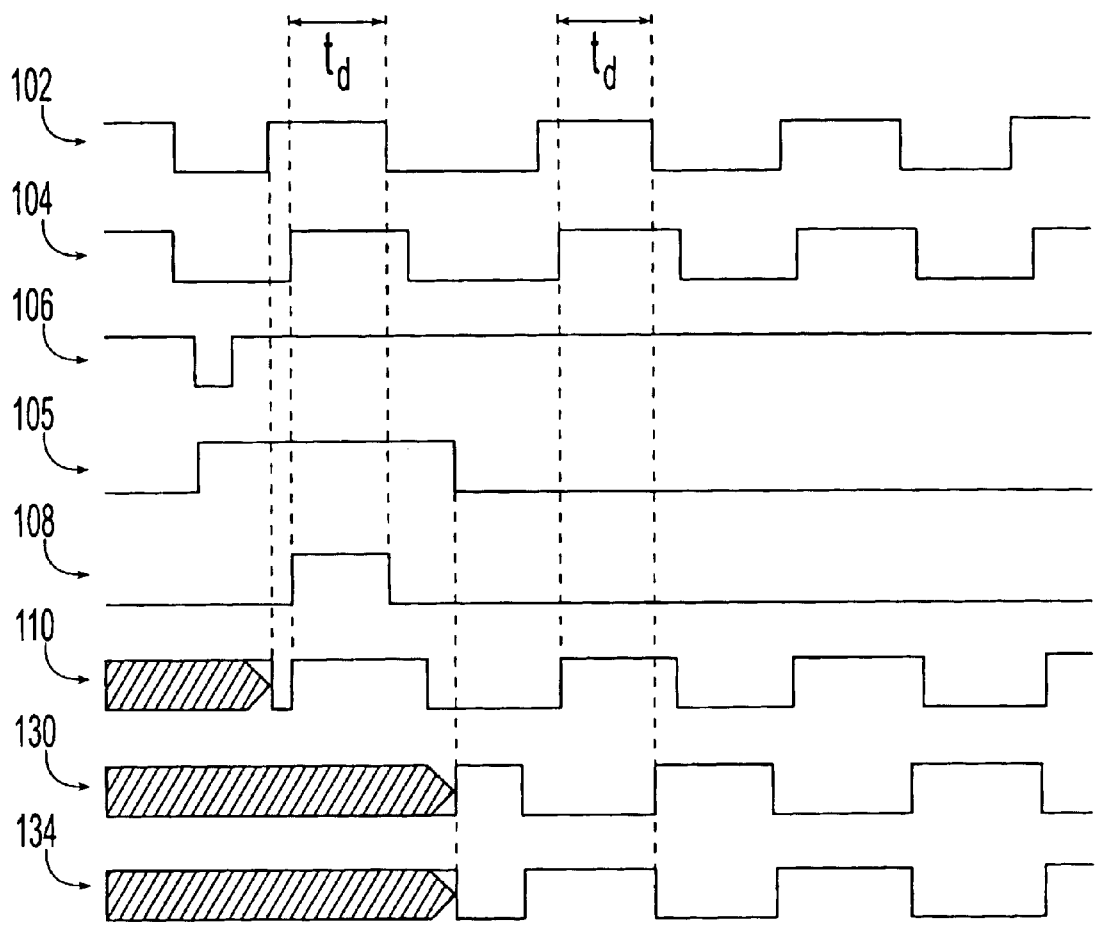
FIG. 3 is a timing diagram for a presently preferred embodiment of a delay adjustment circuit, where an internal clock feedback signal lags a system clock signal.

Referring to FIG. 3, a timing diagram shows an illustrative relationship of the difference-pulse signal on line 108 to other signals when the feedback clock signal on line 104 lags the system clock signal on line 102. Where the feedback clock signal on line 104 is at logic low during the rise of the system clock signal on line 102 (indicating that the feedback clock signal on line 104 is lagging), the interim clock signal on line 110 is equal to the feedback clock signal on line 104, as explained above.

The difference-pulse signal on line 108 will remain at logic low until the interim clock signal on line 110 is at logic high while the system clock signal on line 102 and the reset signal on line 105 are at logic high. When this occurs, the difference-pulse signal on line 108 will transition to and remain at logic high until the system clock signal on line 102 falls. The difference-pulse signal on line 108 will remain at logic high for an amount of time ($t_d$), as shown.

Figure 4:
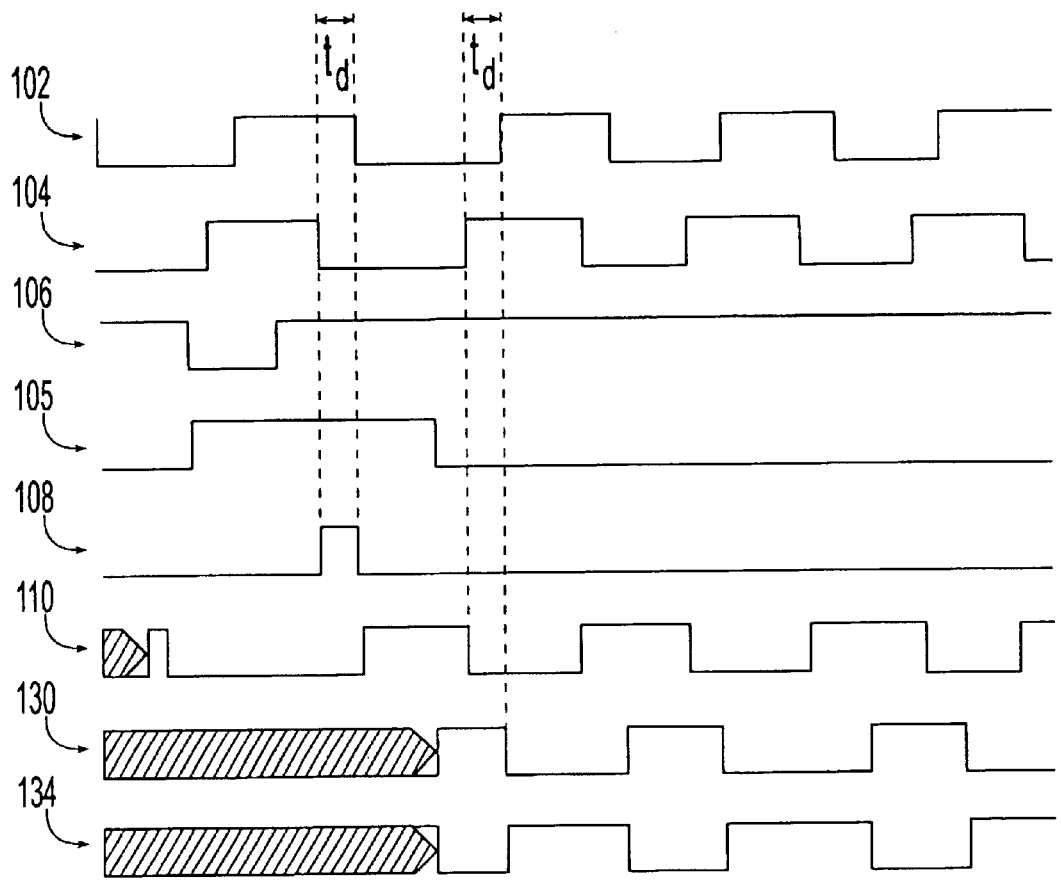
FIG. 4 is a timing diagram for a presently preferred embodiment of a delay adjustment circuit, where an internal clock feedback signal leads a system clock signal.

Referring to FIG. 4, a timing diagram showing an illustrative relationship of the difference-pulse signal on line 108 to other signals when the feedback clock signal on line 104 leads the system clock signal on line 102. Where the feedback clock signal on line 104 is at logic high during the rise of the system clock signal on line 102 (indicating that the feedback clock signal on line 104 is leading), the interim clock signal on line 110 is equal to an inversion of the feedback clock signal on line 104, as explained above. Other than this inversion, the circuit operates the same as when the feedback clock signal on line 104 lags the system clock signal on line 102, so that the difference-pulse signal on line 108 is high for an amount of time ($t_d$), as shown.

Figure 5:
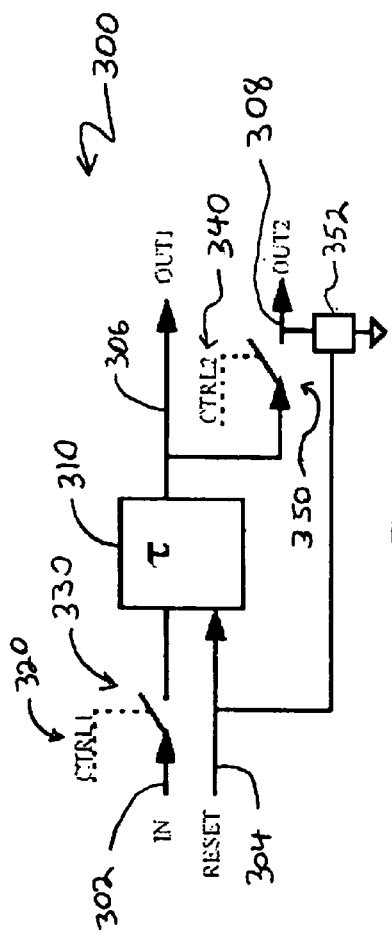
FIG. 5 is a block diagram of a cell for a delay unit or a delay control unit of a delay adjustment circuit.

Turning to FIG. 5, a block diagram of a cell 300 is shown. The delay unit 500 and the delay control unit 400 may be comprised of a plurality of cells similar to cell 300. Each cell 300 includes a delay unit 310 that provides a delay of time $\tau$, an input switch 330, and an output switch 350. Cells 300 used in delay control unit 400 may also include an output reset switch 352. The delay unit 310 may be a latch followed by an inverter, a resistor-capacitor unit, or some other means of delaying a signal. The input switch 330 and the output switch 350 may each be any switching means operable to selectively couple an input line to an output line based on a control signal.

The delay unit 310 receives an input signal on line 302 and a reset signal on line 304, and provides a first output signal on line 306. The input switch 330 receives an input control signal on line 320, and provides the input signal on line 302 to the delay unit 310 when the input control signal on line 320 is at logic high. The output switch 350 receives an output control signal on line 340, and provides the first output signal on line 306 as a second output signal on line 308 when the output control signal on line 340 is at logic high. The output reset switch 352 may reset the second output signal on line 308 to logic low when activated by a reset signal on line 304. External control logic for cell 300 may be arranged so that the output reset switch 352 is only activated when the output switch 350 is off.

Figure 6:
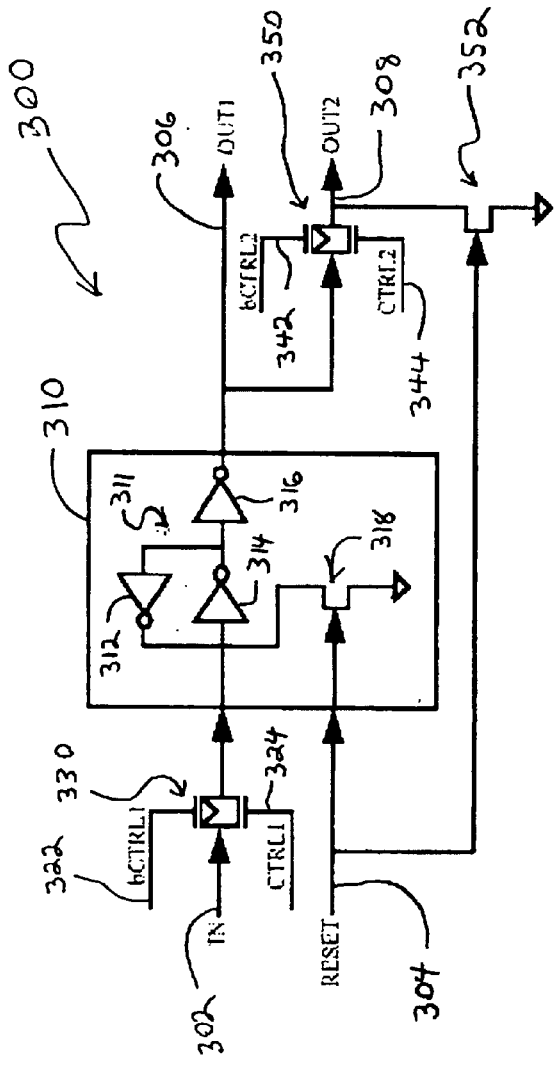
FIG. 6 is a logic diagram of a presently preferred embodiment of a cell for a delay unit or a delay control unit of a delay adjustment circuit.

Turning to FIG. 6, a logic diagram of a presently preferred embodiment for the cell 300 is shown. The delay unit 310 may include a latch 311, and a latch reset switch 318. The latch 311 may include a first inverter 312, a second inverter 314, and a following inverter 316. The latch reset switch 318 may include a transistor. Similarly, the output reset switch 352 may also include a transistor.

The input switch 330 and the output switch 350 may each include a transfer gate. The input control signal on line 320 may include a non-inverted input control signal on line 324 and an inverted input control signal on line 322. Similarly, the output control signal on line 340 may include a non-inverted output control signal on line 344 and an inverted output control signal on line 342.

In operation, the cell 300 is first cleared by a reset signal on line 304 while the output switch 350 is deactivated by the output control signal on line 340. This reset signal on line 304 activates latch reset switch 318, which cause the latch 311 to store a logic low value. The reset signal on line 304 also activates the output reset switch 352, which causes the second output signal on line 308 to be at logic low.

Subsequently, when the input signal on line 302 is at logic high and input switch 330 is activated, the latch 311 may store a logic high value. The value stored by latch 311 remains at logic high until either the input signal on line 302 falls to logic low while input switch 330 is active, or the latch 311 is reset by the reset signal on line 304. The first output signal on line 306 is equal to the logic value stored by latch 311, and the second output signal on line 308 is either equal to the value stored by latch 311, or it is disconnected.

Figure 7:
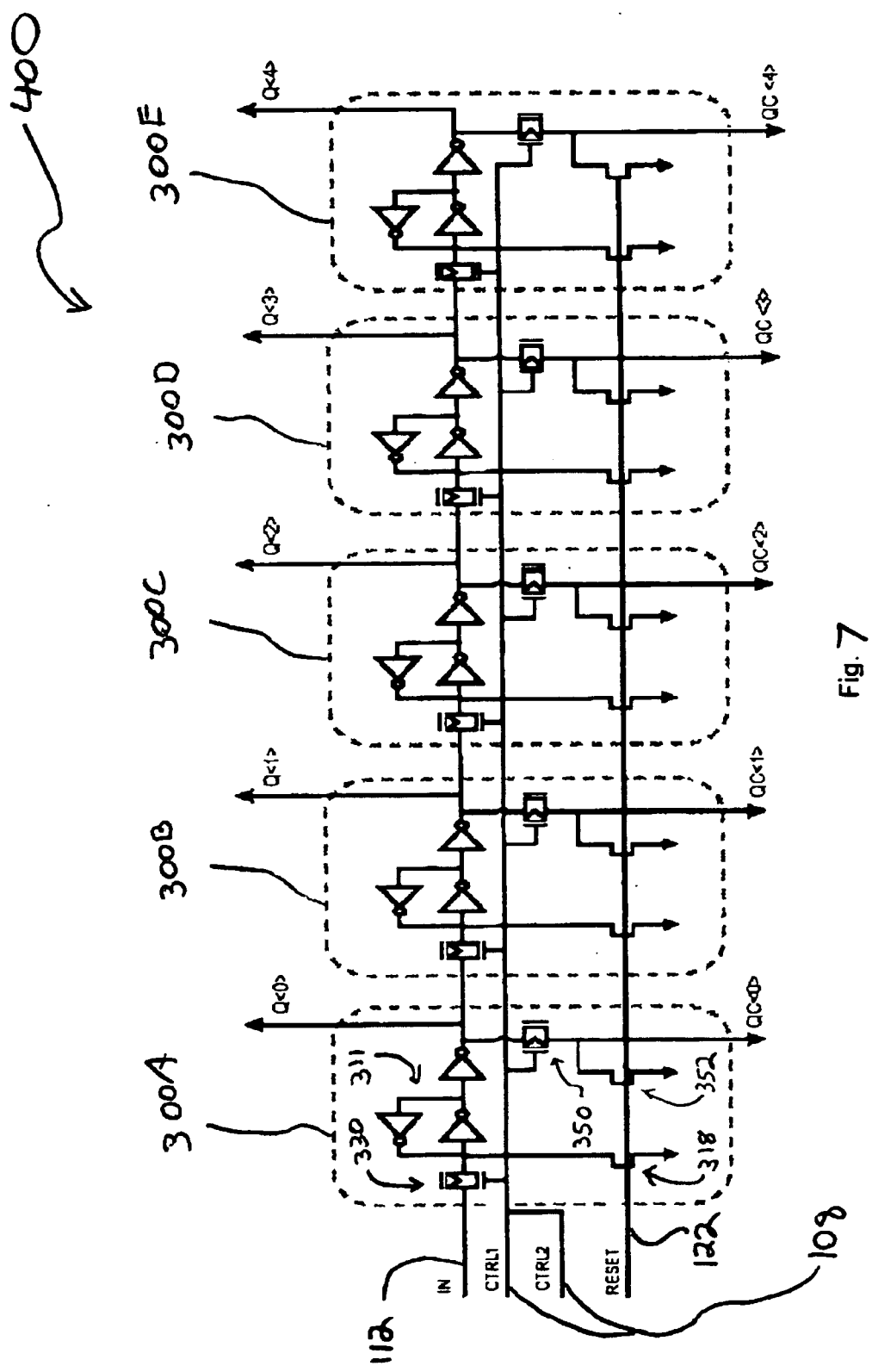
FIG. 7 is a logic diagram of a presently preferred embodiment of a delay control unit of a delay adjustment circuit.

The delay control unit 400 may be any circuit or device that provides a means for generating a plurality of output signals that indicate the phase difference between the system clock signal and the interim clock signal. Turning to FIG. 7, a logic diagram of a presently preferred embodiment of the delay control unit 400 is shown.

The delay control unit 400 includes control cells 300A–300E. This illustrative embodiment contains five control cells 300. However, the delay control unit 400 may contain any number (n+1) control cells 300 in any configuration capable of generating output signals Q(0:n) and QC(0:n) for controlling (n+1) delay cells of the delay unit 500.

The input of the control cell 300A is coupled to line 112, which is at logic high (see FIG. 1). The input of the remaining control cells 300 receive the output signal Q<i> of the preceding control cell 300A–300D. The input switch 330 and output switch 350 of each control cell 300A–300E is controlled by the difference-pulse signal on line 108. The latch reset switch 318 and output reset switch 352 of each control cell 300A–300E arc controlled by the inverted enable signal on line 122 (see FIG. 1). The output signals Q<0> through Q<4> and QC<0> through QC<4> are transmitted from control cells 300A–300E to delay cells 300V–300Z of the delay unit 500, respectively, as explained below.

In operation, following a reset from inverted enable signal on line 122, each latch 311 of each of the control cells 300A–300E stores a logic low value, and each output QC<0> through QC<4> is at logic low. The input switch 350 of each of the control cells 300A–300E is activated when the difference-pulse signal on line 108 transitions from logic low to logic high. After one unit of time τ (the delay time of each delay unit 310) transpires, the control cell 300A stores a value of logic high, because its input is coupled to line 112, which is coupled to logic high. For each additional unit of time τ that transpires while the difference-pulse signal on line 108 is at logic high, the next control cell 300B–300E in the chain stores a value of logic high. This occurs because the output signal Q<i> of the previous control cell 300A–300D transitions to logic high.

When the difference-pulse signal on line 108 transitions to logic low, the input switch 330 of each of the control cells 300A–300E is deactivated, so that the value stored in each latch 311 persists until the control cells 300A–300F are reset. Also, when the difference-pulse signal on line 108 transitions to logic low, the output switch 350 of each of the control cells 300A–300E is activated, so that the output signals QC<0> through QC<4> indicate the logic value stored in each latch 311 of the control cells 300A–300E, respectively.

Figure 8:
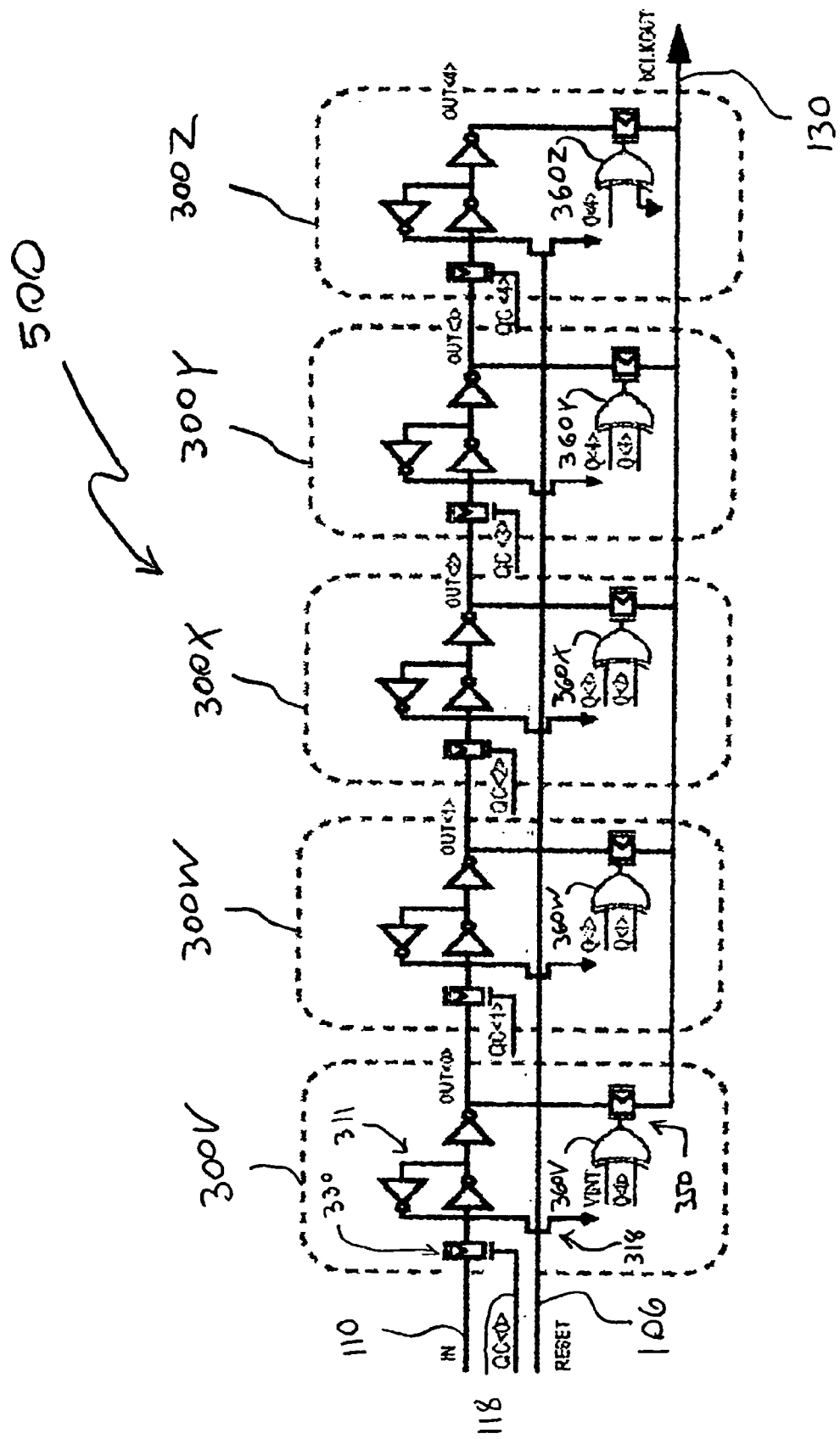
FIG. 8 is a logic diagram of a presently preferred embodiment of a delay unit of a delay adjustment circuit.

The delay unit 500 may be any circuit or device that provides a means for delaying the interim clock signal by an amount of time that is a function of the phase difference indicated by the plurality of output signals to produce a delayed interim clock signal, and providing the delayed interim clock signal as an internal clock signal. Turning to FIG. 8, a logic diagram of a presently preferred embodiment of the delay unit 500 is shown.

The delay unit 500 includes delay cells 300V–300Z. This illustrative embodiment contains five delay cells 300. However, the delay unit 500 may contain any number (n+1) delay cells 300 in any configuration capable of delaying a clock signal in accordance with the outputs Q<0:n> and QC<0:n> of delay control unit 400.

The input of delay cell 300V receives the interim clock signal on line 110. The input of each of the remaining delay cells 300W–300Z receives the output signal OUT<i> of the previous delay cell 300V–300Y. Each input switch 330 of the delay cells 300V–300Z is controlled by the output signal QC<i> from the respective control cell 300A–300E of delay control unit 400. The latch reset switch 318 of each of the delay cells 300V–300Z is controlled by the enable signal on line 106. In illustrative embodiment shown in FIG. 8, the delay cells 300V–300Z do not include an output reset switch 352.

The output switch 350 of each of the delay cells 300V–300Z is controlled by an output of an XOR gate 360V–360Z, respectively. A first input of the XOR gate 360V receives a logic high value (VINT), and a second input of the XOR gate 360V receives the output signal Q<0>. Consequently, the output of the XOR gate 360V is only at logic high when output signal Q<0> is at logic low. In the presently preferred embodiments shown in FIGS. 7 and 8, when output signal Q<0> is at logic low, all output signals Q<0:n> are at logic low.

First and second inputs of the XOR gate 360W receive output signal Q<1> and output signal Q<2>, respectively. Therefore, the output of the XOR gate 360W is only at logic high when output signal Q<1> is at logic high and output signal Q<2> is at logic low. In the presently preferred embodiments shown in FIGS. 7 and 8, when output signal Q<2> is at logic low, all output signals Q<2:n> are at logic low.

In a similar manner, the remaining XOR gates 360X–360Z each receive a signal Q<i> and Q<i+1>. Therefore, only one of the XOR gates 360V–360Z may have an output at logic high at a given time. Consequently, only one transfer gate 250 of the delay cells 300V–300Z may be active at a given time. Because of this, only one output signal OUT<0:4> from one latch 311 of the delay cells 300V–300Z may be provided as the inverted internal clock signal on line 130.

In operation, the delay unit 500 may function with the delay control unit 400 as follows. While the inverted enable signal on line 122 is low, for each period of time τ that the difference-pulse signal on line 108 is at logic high, a virtual value (i) increments such that only output signals Q<0> through Q<i−1> are at logic high. For example, where the virtual value (i) reaches a maximum of "2", only the output signals Q<0:1> are at logic high.

When the difference-pulse signal on line 108 is at transitions to and remains at logic low, output signals QC<0:4> arc activated, and each is equal to the corresponding output signal Q<0:4>. The delay unit 500 receives the output signal Q<0:4> and QC<0:4> as discussed above.

For example, when the virtual value (i) reaches a maximum of "2", output signals Q<0:1> and QC<0:1> are at logic high, and output signals Q<2:4> and QC<2:4> arc at logic low. Consequently, the input switch 330 of each delay cell 300V and 300W is active (conducting), and the input switch 330 of each delay cell 300X–300Z is inactive (not conducting). Therefore, the interim clock signal on line 110 is delayed one unit of time τ by delay cell 300V and one unit of time τ by delay cell 300W. Because output signal QC<1> is at logic high, and output signal QC<2> is at logic low, only the XOR gate 360 will have a logic high output. This logic high output will activate the output switch 350 of the delay cell 300W so that the output signal OUT<1> of the delay cell 300W will be provided as the inverted internal clock signal on line 130.

Referring again to FIG. 3, a timing diagram shows an illustrative relationship between the system clock signal on line 102 and the inverted internal clock signal on line 130 where the feedback clock signal on line 104 lags the system clock signal on line 102. The feedback signal on line 104 is used unaltered to provide the interim clock signal 110. The interim clock signal 110 is delayed by an amount of time ($t_d$) to provide the inverted internal clock signal on line 130, which is 180 degrees out of phase with the system clock signal on line 102. The inverted internal clock signal on line 130 is inverted to provide the internal clock signal on line 134, which is in phase with system clock signal on line 102.

Referring again to FIG. 4, a timing diagram shows an illustrative relationship between the system clock signal on line 102 and the inverted internal clock signal on line 130 where when the feedback clock signal on line 104 leads the system clock signal on line 102. Where the feedback clock signal on line 104 leads rather than lags, it is inverted to provide the interim clock signal on line 110. The interim clock signal 110 is still delayed by an amount of time ($t_d$) to provide the inverted internal clock signal on line 130, which is 180 degrees out of phase with the system clock signal on line 102.

For a given delay unit 500, the maximum delay afforded is (n×τ), where (n) is the number of delay cells 300 in the delay unit 500. The delay control unit 400 should also contain at least (n) cells. Because the DAC 100 uses fewer total cells 300 than a typical DLL circuit to decrease the phase shift between the system clock signal 102 and the feedback clock signal 104, it consumes less power than a typical DLL circuit. Furthermore, the DAC 100 operates independent of system operating frequency and CAS latency.

The embodiments have been discussed with reference to functional blocks identified as modules and components that are not intended to represent discrete strictures and may be combined or further sub-divided in various embodiments as known in the art. In addition, while various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A delay adjustment circuit for a semiconductor device, comprising:
   a difference-pulse generator, wherein the difference-pulse generator receives a system clock signal and a feedback clock signal and provides a difference-pulse signal that indicates a phase difference between the system clock signal and the feedback clock signal, and generates an interim clock signal that is selected from the group comprising the feedback clock signal and an inversion of the feedback clock signal;
   a delay control unit in communication with the difference-pulse generator, wherein the delay control unit receives the difference-pulse signal and provides a plurality of output signals that indicate the phase difference between the system clock signal and the interim clock signal; and
   a delay unit in communication with the difference-pulse generator and the delay control unit, wherein the delay unit receives the interim clock signal and the plurality of output signals, and provides an internal clock signal that is in phase with the system clock signal.

2. The delay adjustment circuit of claim 1, wherein the difference-pulse signal is at logic high for a period of time that the feedback clock signal is at logic low and the system clock signal is at logic high.

3. The delay adjustment circuit of claim 2, wherein the interim clock signal is the feedback clock signal.

4. The delay adjustment circuit of claim 1, wherein the difference-pulse signal is at logic high for a period of time that the feedback clock signal is at logic high and the system clock signal is at logic high.

5. The delay adjustment circuit of claim 4, wherein the interim clock signal is an inversion of the feedback clock signal.

6. The delay adjustment circuit of claim 1, wherein the delay control unit comprises a plurality of control cells and the delay unit comprises a plurality of delay cells.

7. The delay adjustment circuit of claim 6, wherein each control cell of the plurality of control cells provides one output signal of the plurality of output signals, and each delay cell of the plurality of delay cells receives one output signal of the plurality of output signals.

8. The delay adjustment circuit of claim 1, wherein the delay unit delays the interim clock signal by one time unit for each of the plurality of output signals that is at logic high to produce a delayed interim clock signal, and provides the delayed interim clock signal as the internal clock signal.

9. The delay adjustment circuit of claim 1, wherein the interim clock signal is the feedback clock signal when the feedback clock signal is lagging the system clock signal, and the interim clock signal is an inversion of the feedback clock signal when the feedback clock signal is leading the system clock signal.

10. The delay adjustment circuit of claim 1, comprising a pulse generator, wherein the pulse generator receives an enable signal, detects an edge of the enable signal, and generates a reset signal that is at logic high for a first period of time after the edge of the enable signal is detected.

11. The delay adjustment circuit of claim 10, wherein the first period of time is at least a period of the system clock.

12. The delay adjustment circuit of claim 10, wherein the difference-pulse generator is in communication with the pulse generator, receives the reset signal, and provides the difference-pulse signal when the reset signal is at logic high.

13. The delay adjustment circuit of claim 1, wherein the difference-pulse generator determines whether the feedback clock signal is leading the system clock signal by sampling the feedback clock signal during a rising edge of the system clock signal.

14. A method for adjusting the delay of an internal clock of a semiconductor device, the method comprising:
   receiving a system clock signal and a feedback clock signal;
   generating a difference-pulse signal that indicates a phase difference between the system clock signal and the feedback clock signal;
   generating an interim clock signal that is selected from the group comprising the feedback clock signal and an inversion of the feedback clock signal;
   generating a plurality of output signals that indicate the phase difference between the system clock signal and the feedback clock signal;
   delaying the interim clock signal by an amount of time that is a function of the phase difference indicated by the plurality of output signals to produce a delayed interim clock signal; and
   providing the delayed interim clock signal as an internal clock signal.

15. The method of claim 14, wherein generating a difference-pulse signal includes generating a logic high for a period of time that the feedback clock signal is at logic low and the system clock signal is at logic high.

16. The method of claim 14, wherein generating a difference-pulse signal includes generating a logic high for a period of time that the feedback clock signal is at logic high and the system clock signal is at logic high.

17. The method of claim 14, wherein generating an interim clock signal includes inverting the feedback clock signal when the feedback clock signal is leading the system clock signal.

18. The method of claim 14, wherein generating a plurality of output signals includes generating one output signal at logic high for each time unit during a period of the system clock that the system clock signal is at logic high while the interim clock signal is at logic high.

19. The method of claim 14, wherein generating a difference-pulse signal further includes receiving an enable signal, detecting an edge of the enable signal, generating a reset signal that is at logic high for a first period of time after the edge of the enable signal is detected, and generating a logic low when the first period of time after the edge of the enable signal is expired.

20. The method of claim 14, wherein generating an interim clock signal further includes determining whether the feedback clock signal is leading the system clock signal by sampling the feedback clock signal during a rising edge of the system clock signal, and inverting the feedback clock signal when the feedback clock signal is leading the system clock signal.

21. A delay adjustment circuit for a semiconductor device, comprising:

a means for receiving a system clock signal and a feedback clock signal and generating a difference-pulse signal that indicates a phase difference between the system clock signal and the feedback clock signal for generating an interim clock signal that is selected from the group comprising the feedback clock signal and an inversion of the feedback clock signal;

a means for generating a plurality of output signals that indicate the phase difference between the system clock signal and the feedback clock signal; and a means for delaying the interim clock signal by an amount of time that is a function of the phase difference indicated by the plurality of output signals to produce a delayed interim clock signal, and providing the delayed interim clock signal as an internal clock signal.

\* \* \* \* \*